US009265108B2

(12) United States Patent
Lee et al.

(10) Patent No.: US 9,265,108 B2
(45) Date of Patent: *Feb. 16, 2016

(54) LIGHT SOURCE APPARATUS AND LIGHT EMITTING DIODE PACKAGE

(71) Applicant: SAMSUNG ELECTRONICS CO., LTD., Suwon, Gyeonggi-do (KR)

(72) Inventors: Seung Woo Lee, Gyeonggi-do (KR); Sun Ki Kim, Gyeonggi-do (KR); Kyung Pil Nam, Gyeonggi-do (KR); Sung Min Jang, Gyeonggi-do (KR); Ki Won Choi, Gyeonggi-do (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 70 days.

This patent is subject to a terminal disclaimer.

(21) Appl. No.: 14/020,725

(22) Filed: Sep. 6, 2013

(65) Prior Publication Data

US 2014/0070712 A1 Mar. 13, 2014

(30) Foreign Application Priority Data

Sep. 7, 2012 (KR) .................. 10-2012-0099585

(51) Int. Cl.
*H05B 37/02* (2006.01)
*H05B 33/08* (2006.01)

(52) U.S. Cl.
CPC .. *H05B 33/0818* (2013.01); *H01L 2224/48091* (2013.01)

(58) Field of Classification Search
CPC ............... H05B 37/02; H05B 33/0806; H05B 33/0818; H05B 33/0821; H05B 33/0824; H05B 33/0842; H01L 2224/48091; H01L 2924/00014

USPC .......... 315/185 R, 186, 209 R, 224, 225, 291, 315/307, 308, 312

See application file for complete search history.

(56) References Cited

U.S. PATENT DOCUMENTS

| 5,287,372 A * | 2/1994 | Ortiz .......................... 372/38.07 |
| 6,577,072 B2 * | 6/2003 | Saito .................. H05B 33/0809 315/185 R |
| 7,321,206 B2 * | 1/2008 | Kang et al. .................... 315/291 |
| 2014/0070714 A1 | 3/2014 | Lee et al. |

FOREIGN PATENT DOCUMENTS

| KR | 10-0963138 B1 | 6/2010 |
| KR | 10-096876 B1 | 7/2010 |
| KR | 2012-0012084 A | 2/2012 |
| KR | 2012-0031215 A | 3/2012 |

OTHER PUBLICATIONS

U.S. Office Action dated Jan. 23, 2015, issued in corresponding U.S. Appl. No. 14/022,143. 11 pgs.

* cited by examiner

*Primary Examiner* — Jimmy Vu
(74) *Attorney, Agent, or Firm* — McDermott Will & Emery LLP

(57) ABSTRACT

There is provided a light source apparatus including at least one light emitting diode (LED) string including at least one light emitting diode and at least one inductance unit generating an induced current according to a change in a current applied to the light emitting diode, a main switch controlling power applied to the LED string according to an on/off switching operation, and a capacitor charged with a voltage of the power applied to the LED string when the main switch is switched on and applying the charged voltage to the LED string when the main switch is switched off.

19 Claims, 12 Drawing Sheets

LIGHT SOURCE APPARATUS AND LIGHT EMITTING DIODE PACKAGE

CROSS-REFERENCE TO RELATED APPLICATIONS

This application claims the benefit of priority to Korean Patent Applications No. 10-2012-0099585 filed on Sep. 7, 2012, in the Korean Intellectual Property Office, the disclosure of which is incorporated herein by reference.

TECHNICAL FIELD

The present application relates to a light source apparatus and a light emitting diode package.

BACKGROUND

In order to drive a light emitting device having a light emitting diode (LED), a separate light source apparatus provided with an LED driving circuit is required. That is, since related art illumination lamps directly receive alternating current (AC) power to be driven, a separate light source apparatus is unnecessary, but an LED has characteristics such that it is driven by direct current (DC) power. In general, in an LED device, AC power is rectified, and in order to convert a DC signal rectified from the AC power to have a required magnitude, a DC/DC converter is included in a light source apparatus. Thus, demand for a scheme for miniaturization of a light source apparatus and an improvement in power efficiency under the conditions described above has been increased.

SUMMARY

An aspect of the present disclosure provides a miniaturized light source apparatus having power consumption efficiency.

An aspect of the present disclosure provides a light emitting diode package having the light source apparatuses described above, disposed on an inside thereof to be distributed.

According to an aspect of the present disclosure, there is provided a light source apparatus including: at least one light emitting diode (LED) string including at least one light emitting diode and at least one inductance unit generating an induced current according to a change in a current applied to the light emitting diode. A main switch controls power applied to the LED string according to an on/off switching operation. A capacitor is charged with a voltage of the power applied to the LED string when the main switch is switched on and the capacitor applies the charged voltage to the LED string when the main switch is switched off.

The inductance unit may be disposed inside a circuit substrate while including a single-layer single conductive wire or a multilayer conductive layer of a helical structure, containing an inductance component.

The light source apparatus may further include a controller for receiving an electrical signal output from the LED string to output a switching control signal, and the main switch for performing an on/off switching operation in response to the switching control signal of the controller.

The controller may output a PWM control signal as the switching control signal, and a PWM signal period of the switching control signal may be set to be smaller as an inductance value of the inductance unit is decreased.

The light source apparatus may further includes a second switch controlling the power applied to the LED string from the main switch according to an on/off switching operation, and the capacitor may be charged with the voltage of the power applied to the LED string when the main switch and the second switch are switched on, and may apply the charged voltage to the LED string when the main switch or the second switch is switched off.

The light source apparatus may further include a voltage stabilizer connected in parallel between an output terminal of the main switch and an input terminal of the second switch.

The light source apparatus may further include a first controller configured for receiving the electrical signal output from the LED string and outputting a first switching control signal, and a second controller configured for outputting a second switching control signal, and the main switch and the second switch may respectively perform an on/off switching operation in response to the first switching control signal and the second switching control signal.

In this case, the first control unit and the second control unit may output a first PWM control signal and a second PWM control signal as the first switching control signal and the second switching control signal, respectively, a signal period of the second PWM control signal may be longer than that of the first PWM control signal, and an on time of the second PWM control signal may be longer than an on time of the first PWM control signal.

When a set of the LED string, the main switch, the capacitor and the second switch is defined as a single light emitting series, the light emitting series may be at least two connected in parallel with each other.

When a set of the LED string, the capacitor and the second switch is defined as a single light emitting series, the light emitting series may be at least two connected in parallel with each other.

The light emitting diode included in the LED string may be one, and when a set of the LED string, the main switch, the capacitor and the second switch is defined as a single light emitting object, the light emitting object may be provided in plural, connected to one another in series and in parallel.

The light emitting diode included in the LED string may be one, and when a set of the LED string, the capacitor and the second switch is defined as a single light emitting object, the light emitting object may be provided in a plurality, connected to one another in series and in parallel.

According to an aspect of the present disclosure, there is provided a light emitting diode package. The package may include: a light emitting diode having an anode terminal and a cathode terminal; a package substrate including a capacitor, an inductance unit, and a switching device having a control signal input terminal, and including the light emitting diode mounted thereon. An input terminal applies an electrical signal to the anode terminal of the light emitting diode. An output terminal receives the electrical signal output from the cathode terminal of the light emitting diode. A control terminal applies a control signal to the control signal input terminal of the switching device. At least one of the inductance unit is connected between the anode terminal of the light emitting diode and the input terminal or between the cathode terminal of the light emitting diode and the output terminal, and generates an inducted current according to a change in a current applied to the light emitting diode. The capacitor is connected in parallel with the light emitting diode, and the switching device performs an on/off switching operation in response to a control signal applied to the control signal input terminal from the control terminal so as to control the electrical signal applied to the light emitting diode.

The light emitting diode package may further include a lead out conductor embedded in the package substrate, and the anode terminal of the light emitting diode and the input terminal and the cathode terminal of the light emitting diode and the output terminal may be electrically connected to each other through the lead out conductor, respectively.

The input terminal, the output terminal, and the control terminal may be spaced apart from one another so as to be electrically isolated.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
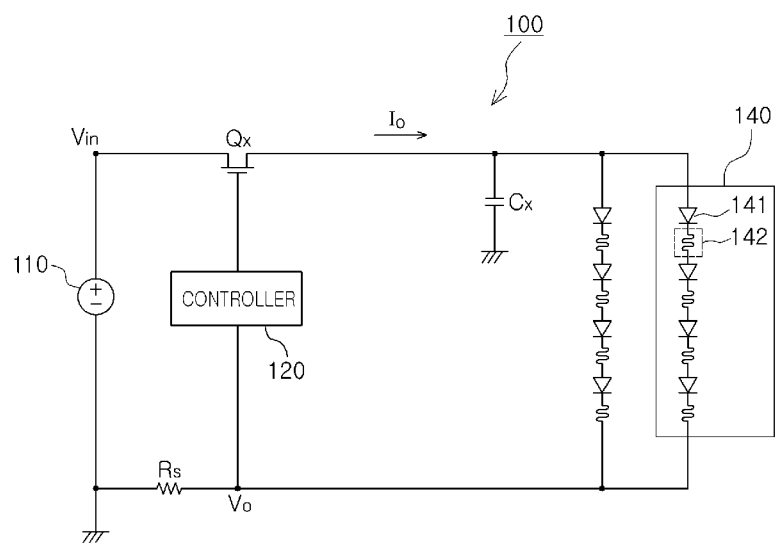
FIG. 1 is a circuit diagram of a light source apparatus according to an embodiment of the present disclosure.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

Hereinafter, embodiments of the present inventive concept will be described in detail with reference to the accompanying drawings. The inventive concept may, however, be embodied in many different forms and should not be construed as being limited to the embodiments set forth herein. Rather, these embodiments are provided so that this disclosure will be thorough and complete, and will fully convey the scope of the inventive concept to those skilled in the art.

In the drawings, the shapes and dimensions of elements may be exaggerated for clarity, and the same reference numerals will be used throughout to designate the same or like elements.

FIG. 1 is a circuit diagram of a light source apparatus according to an embodiment.

Referring to FIG. 1, a light source apparatus 100 according to an embodiment may include at least one light emitting diode (LED) string 140, a main switch Qx and a capacitor Cx.

The LED string 140 may include at least one light emitting diode 141 and at least one inductance unit 142 generating an induced current according to a change in a current applied to the light emitting diode 141.

The inductance unit 142 may include an inductance component to generate an induced current according to a magnitude of change in a current applied to the light emitting diode 141. The form (wave shape) of the inductance unit 142 shown in FIG. 1 is only illustrated in the circuit diagram to allow for easy recognition of the inductance unit 142, regardless of an actual shape of the inductance unit 142. The inductance unit 142 will be described in detail below. In addition, the present embodiment provides a structure in which two LED strings 140 respectively including four light emitting diodes 141 and four inductance units 142 are connected to each other in parallel, but the number of the LED strings 140 and the number of LEDs 141 included in the respective LED string 140 may be appropriately varied as needed.

The main switch Qx may control a power source 110 applied to the LED string 140 according to a on/off switching operation, and may perform a repeated switching operation itself without a switching control signal applied thereto and may also perform an on/off switching operation in response to a switching control signal applied from a controller outputting the switching control signal. In this case, the light source apparatus according to the present embodiment may further include a controller 120 receiving an electrical signal output from the LED string 140 and outputting the received switching control signal.

Figure 2A:
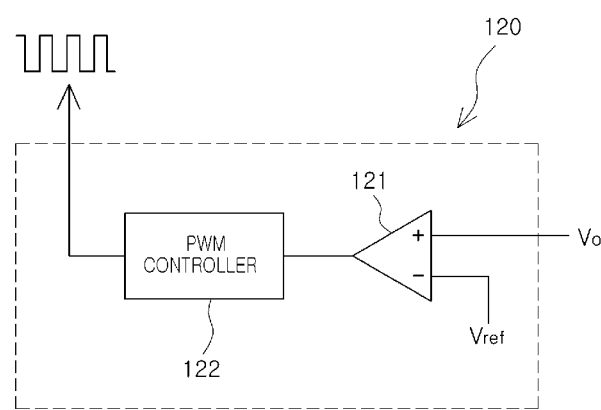
FIGS. 2A and 2B are circuit diagrams illustrating a controller according to an embodiment of the present disclosure.

In detail, as shown in FIG. 2A, the controller 120 may include a comparator 121 receiving an electrical signal output from the LED string 140 to compare the received electrical signal with a reference signal, for example, a reference voltage $V_{ref}$, and output a comparison result, and a pulse width modulation (PWM) controller 122 providing a pulse width-modulated (PWM) control signal for controlling the main switch Qx to the main switch Qx according to the comparison result from the comparator 121.

Figure 2B:
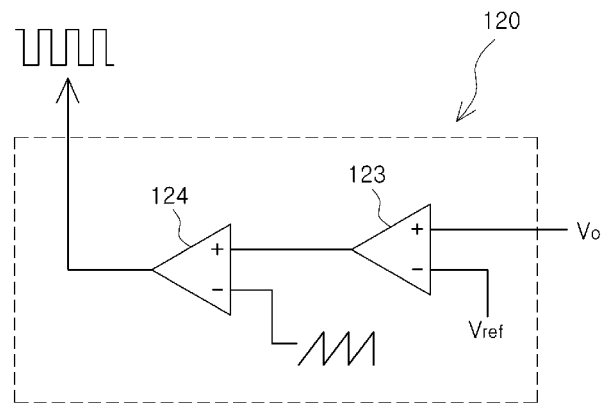

In addition, as shown in FIG. 2B, the controller 120 may include two comparators, that is, a first comparator 123 receiving an electrical signal output from the LED string 140 to compare the received electrical signal with the reference signal, for example, the reference voltage $V_{ref}$, and output a comparison result, and a second comparator 124 receiving an output signal from the first comparator 123 to compare the received output signal with a reference pulse and output a comparison result thereof. Here, the reference pulse may be a sawtooth waveform having a predetermined frequency.

The main switch Qx may be a switching device used in a direct current to direct current (DC/DC) converter, but is not limited thereto and thus, for example, a transistor may be used therefor.

The capacitor Cx may charge a voltage applied to the LED string 140 from the power source 110 when the main switch Qx is switched on, and may form a closed loop with the LED string 140 to be connected to each other when the main switch Qx is switched off such that the pre-charged voltage may be applied to the LED string 140.

Figure 5A:
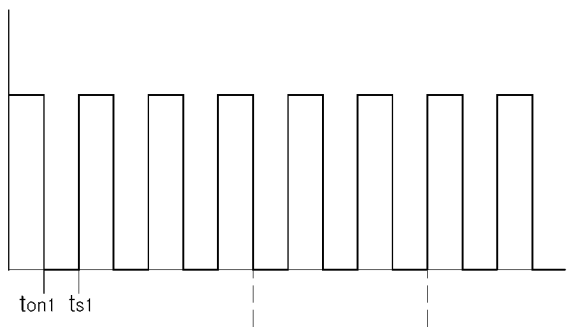
FIGS. 5A to 5C are graphs illustrating output waveforms of first and second switching control signals and a second switch according to the embodiment of FIG. 4.

First, operation according to the present embodiment will be described. In the present embodiment, the main switch Qx may receive a switching control signal, that is, a PWM control signal, from the controller 120 to repeatedly perform an on/off switching operation, and here, a switching control signal waveform may be as illustrated in FIG. 5A. Therefore, as the main switch Qx repeatedly performs the on/off switching operation, an electrical signal output from the main switch Qx may be measured as a waveform as illustrated in FIG. 5A, similarly to the switching control signal waveform. In a case in which a period of the waveform is represented by $t_{s1}$ and a switching on period is represented by $t_{on1}$, an overall average current Io applied to the LED string 140 may be defined by the following equation.

$$V_{in} \times \frac{t_{on1}}{t_{s1}} = \frac{I_o}{N} \times R_o \Rightarrow I_o = \frac{V_{in}t_{on1}}{R_o t_{s1}} N$$

(Here, N indicates the number of LED strings 140, and $R_o$ indicates a single equivalent resistor in the LED strings 140 connected to each other in series). That is, $I_o$ applied to the LED string 140 may be controlled by appropriately changing the period and an on-time duty ratio of the main switch Qx.

In detail, in the switching on period, a current may be applied to the respective LED strings 140 through the main switch Qx from the power source 110. Here, a portion of the current may be stored in the inductance unit 142 present in the LED string 140, as magnetic energy. In addition, a portion of voltage applied to the LED string 140 from the power source 110 may be charged as an electrical charge in the capacitor Cx.

When a switching off period begins, the LED string 140 may be opened from the power source, the capacitor Cx and the LED string 140 may form a closed loop, and magnetic energy stored in the inductance unit 142 may be discharged as a current to flow in the LED string 140. In order to allow a current to smoothly flow therethrough, the pre-charged charge of the capacitor Cx may provide a predetermined amount of voltage, and in this case, the current may flow through a positive (+) terminal of the capacitor Cx and the respective light emitting diodes 141 disposed in the LED string 140 from at least one or more inductance units 142.

Here, the capacitance of the capacitor Cx may not necessarily be higher, and the capacitor Cx having relatively low capacitance may be employed as long as it can help the current smoothly flow through the light emitting diodes 141 from the inductance units 142 in consideration of the dimension of the light source apparatus 100 or an increase in manufacturing costs due to the capacitor Cx. In addition, an embedded capacitor may be used, but is not limited thereto. The embedded capacitor will be described below.

The inductance unit 142 will be described in more detail below.

A magnetic field may generally be generated around a conductive wire through which a current flows and a predetermined amount of parasitic inductance may be present therearound. The inductance unit 142 may be provided by setting the conditions with respect to a length or a thickness of the conductive wire, or the like, such that the inductance unit 142 may have a predetermined inductance value through the properties described above to generate an induced current for the light emitting diode 141. For example, the length or thickness of the conductive wire may be set to have inductance of about 300 nH to 4.7 μH.

Figure 3A:
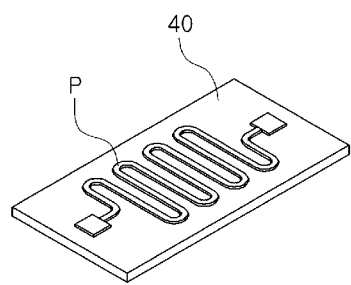
FIGS. 3A to 3D illustrate an inductance unit and a capacitor byway of example, according to an embodiment to the present disclosure.
Figure 3B:
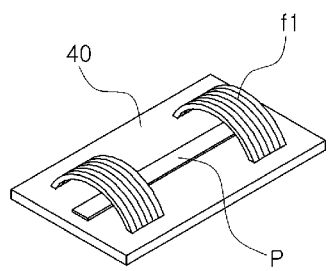
Figure 3C:
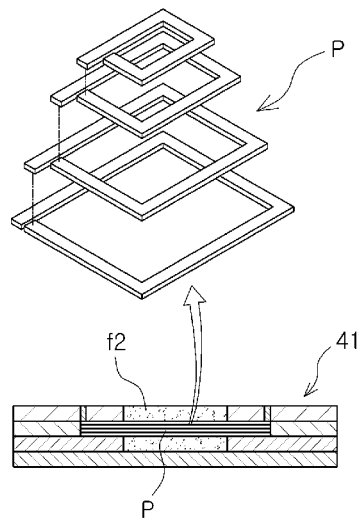

In more detail, FIGS. 3A to 3C illustrate the inductance unit 142 according to an embodiment by way of example.

With reference to FIGS. 3A and 3B, the inductance unit 142 according to the embodiment may be implemented by a single-layer single conductive wire. The single-layer single conductive wire may be implemented by a single conductive wire and may be obtained by forming a conductive pattern P of a printed circuit board 40 to be elongated as shown in FIG. 3A or by inserting a tube type ferrite bead f1 in the vicinity thereof to control an inductance value as shown in FIG. 3B.

In addition, the inductance unit 142 according to the embodiment may be implemented by forming conductive layers P having a spiral structure on a multilayer printed circuit board 41 as shown in FIG. 3C. The inductance unit 142 shown in FIG. 3C may have a structure in which the multilayer printed circuit board 41 formed of four layers, that is, insulators, is included therein and the conductive layers P having the multilayer spiral structure are formed on a second layer, but is not limited thereto. In addition, the inductance unit 142 may further include a via hole penetrating first to third layers and ferrite f2 formed in the via hole so as to control the inductance value to have a predetermined value.

As such, the inductance unit 142 may also be implemented to be included in the printed circuit board, and further, the light emitting diodes 141 included in the LED string 140 may be mounted on the printed circuit board such that at least one or more light emitting diodes 141 are connected to one another through a conductive pattern of the printed circuit board so as to have an array structure. As described above, FIGS. 3A to 3C illustrate the inductance unit 142 according to the embodiment by way of example, and thus are not limited thereto.

Meanwhile, the inductance unit 142 may have an inductance value lower than that of a general inductor device provided per separate device unit. Therefore, counter electromotive force generated in a switching off period of the main switch Qx, $$V_r = -L\frac{di}{dt}$$

($V_r$ refers to counter electromotive force and L and I respectively refer to an inductance and a through current of the inductance unit), that is, a magnitude of an absolute value of the counter electromotive force may have a sufficiently low value. That is, in this case, a free-wheeling diode for protecting different devices from the counter electromotive force may not be required in a circuit, but since an inductance value is a relatively low value, a generated amount of an induced current may be small as compared to that in a general inductor device provided for each device. However, the inductance unit 142 according to the present embodiment may be provided in each LED string 140, and thus, an induced current generated in each inductance unit 142 is not distributed to different LED strings 140, but may only flow in the respective LED strings 140 and thus an inductance (the generation of induced current) having a relatively high value is not necessarily required. However, the inductance value of the inductance unit 142 may also be set to have a required value by setting the length or thickness of the conductive wire.

In addition, in a case in which the inductance value of the inductance unit 142 is lower than a required value, an operation may be performed to be similar to that in the case in which the inductance value is relatively high, by increasing a frequency of power applied to the LED string. That is, frequency of an electrical signal applied to the LED string may be increased by setting the on/off switching period of the main switch Qx to be relatively short such that the light source apparatus 100 may only be smoothly driven by the inductance unit 142 having a relatively low inductance value, which may be implemented by setting a signal period of a switching control signal, for example, a PWM control signal, controlling the on/off switching operation to be relatively short in the main switch Qx.

Figure 3D:
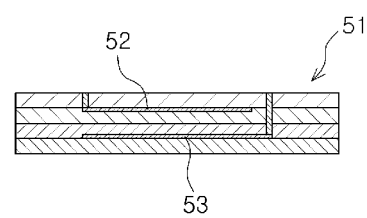

FIG. 3D illustrates an embedded capacitor described above. With reference to FIG. 3D, the embedded capacitor may be implemented by forming a conduction layer having a multilayer structure on a multilayer printed circuit board 51. In detail, the capacitor having an embedded structure may include a multilayer printed circuit board configured of four insulating layers and may employ a conductive layer 52 formed on a second layer and a conductive layer 53 formed on a third layer therein.

According to the embodiment, the light source apparatus 100 may include the inductance unit 142 included in the LED string 140 without a separate inductance device and a freewheeling diode therein, such that the dimensions of the light source apparatus 100 may be effectively reduced.

Figure 4:
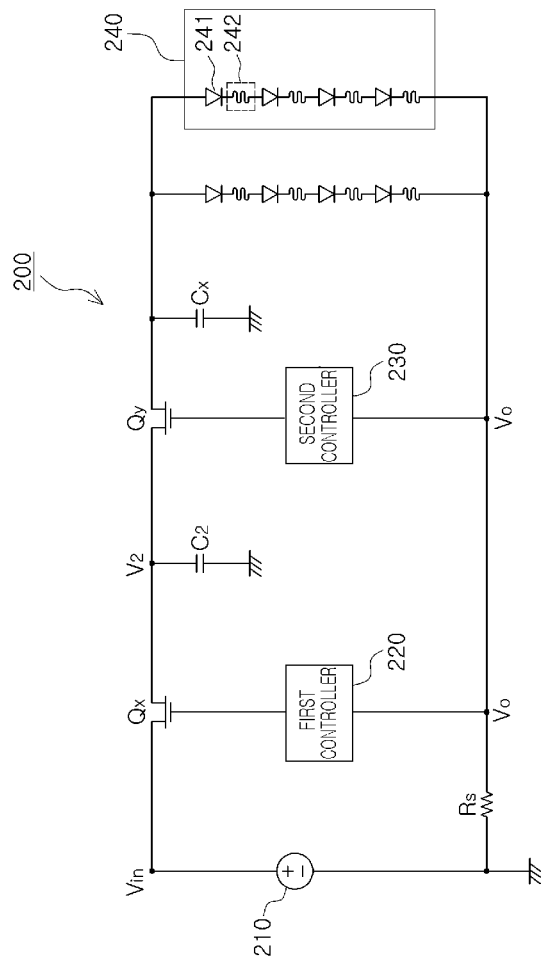
FIG. 4 is a circuit diagram of a light source apparatus according to another embodiment of the present disclosure.

FIG. 4 is a circuit diagram of a light source apparatus 200 according to another embodiment.

With reference to FIG. 4, the light source apparatus 200 may further include a second switch Qy controlling power applied from the main switch Qx to an LED string 240 according to an on/off switching operation. In this case, the capacitor Cx may have a connection structure so as to be charged with a voltage of power applied to the LED string 240 (including LED 241 and inductance unit 242) from the power source 210 when the main switch Qx and the second switch Qy are switched on and to apply the charged voltage to the LED string 240 when either of the main switch Qx and the second switch Qy is switched off.

Here, the main switch Qx and the second switch Qy may respectively receive first and second switching control signals from first and second controller 220 and 230 to then repeatedly perform an on/off switching operation, and the configuration of the first and second controller 220 and 230 may be the same as the controller described in the afore-described embodiment. For example, the light source apparatus 200 may include a comparator comparing an electrical signal output from the LED string 240, and a reference signal, for example, reference voltages $V_{ref1}$ and $V_{ref2}$ to each other and outputting comparison results therefrom, and a PWM controller providing pulse width-modulated first and second PWM control signals for controlling respective switches to the main switch Qx and the second switch Qy, respectively, according to the comparison results from the comparator. In addition, the first controller 220 and the second control unit 230 may be implemented as a single controller.

Figure 5B:
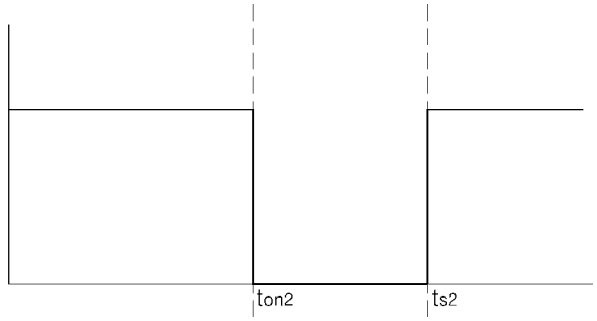
Figure 5C:
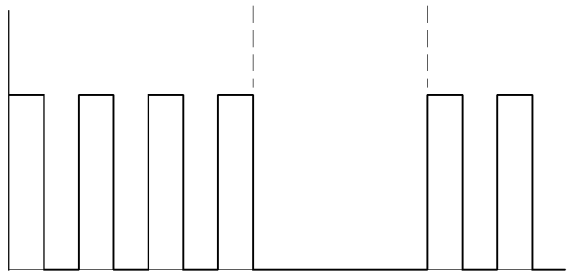

FIGS. 5A and 5B are graphs schematically illustrating first and second switching control signal waveforms according to the embodiment, and FIG. 5C is a graph schematically illustrating an electrical signal waveform that may be measured in an output terminal of the second switch Qy. According to the present embodiment, the light source apparatus 200 may implement a burst mode scheme through the first and second switches Qx and Qy.

In detail, a signal period $t_{s1}$ of a first PWM control signal as a first switching control signal output by the first controller 220, and a signal period $t_{s2}$ of a second PWM control signal as a second switching control signal output by the second control unit 230 may satisfy the following conditional equation (1).

In addition, an on time $t_{on1}$ of the first PWM control signal and an on time $t_{on2}$ of the second PWM control signal may satisfy the following conditional equation (2).

$$t_{s1} \leq t_{s2} \quad \text{Conditional Equation (1)}$$

$$t_{on1} \leq t_{on2} \quad \text{Conditional Equation (2)}$$

When referring to the graphs of FIGS. 5A to 5C in a state in which the conditions described above are satisfied, a degree of freedom in determination of a duty ratio may be improved and power consumption efficiency may be improved in the setting of an excessive duty ratio or a change therein, as compared to the case in which the power 210 applied to the LED string 240 is controlled by a single switch. However, the waveforms and conditional equations (1) and (2) illustrated in FIGS. 5A to 5C are provided by way of example, and a PWM signal period and a duty ratio of a first switching control signal and a second switching control signal may be appropriately varied according to the necessity.

Enhancement in the power consumption efficiency according to the present embodiment will be described in detail.

Figure 14:
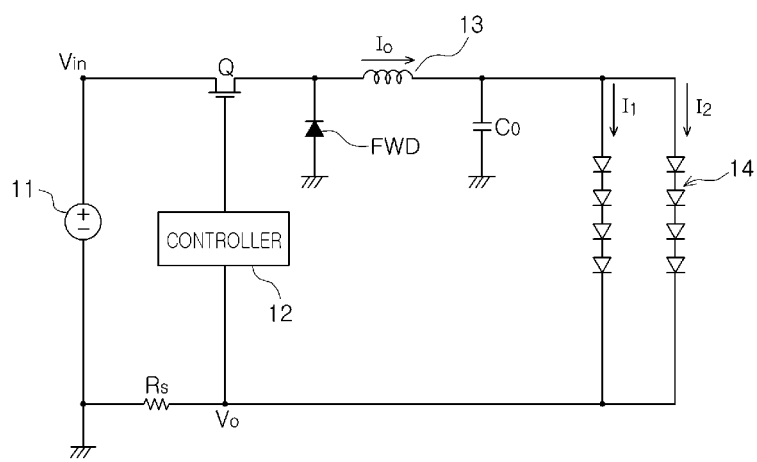
FIG. 14 is a circuit diagram of a conventional direct current to direct current (DC to DC) converter.

FIG. 14 illustrates a light source apparatus including a conventional buck type DC to DC converter and is provided to clearly understand characteristics of the embodiments, and thus, is not limited thereto.

First, in the case of the light emitting apparatus shown in FIG. 14, maximum potential difference $V_{Qmax}$ and $V_{FWDmax}$ applied to input and output terminals of a switch Q and a free-wheeling diode FWD are respectively equal to an applied voltage $V_{in}$ of the power 11, and average currents $I_{Qavg}$ and $I_{FWDavg}$ flowing in the switch Q and the free-wheeling diode FWD may be respectively $$\frac{I_o^2 R_o}{V_{in}} \text{ and } I_o - \frac{I_o^2 R_o}{V_{in}}.$$

Therefore, conduction power loss $P_{Qpass}$, $P_{FWDpass}$ by the switch Q and the free-wheeling diode FWD may be respectively calculated as $$\left(\frac{I_o^2 R_o}{V_{in}}\right)^2 R_{sw} \text{ and } \left(I_o - \frac{I_o^2 R_o}{V_{in}}\right)^2 R_{sw},$$

and a switching power loss $P_{Qsw}$, $P_{FWDsw}$ of the switch Q and the free-wheeling diode FWD may be respectively calculated as $$\frac{C_{sw} V_{in}^2}{T_s}.$$

($R_o$ indicates an equivalent resistor of a single LED string 240, $R_{sw}$ indicates a resistance of the switch Q, and $C_{sw}$ indicates a capacitance of both terminals of the switch Q).

Meanwhile, according to the present embodiment of FIG. 4, maximum potential differences $V_{Qx\_max}$ and $V_{Qy\_max}$ applied to input and output terminals of the main switch Qx and the second switch Qy may become $V_{in}-V_2$ and $V2-I_o R_o$.

In addition, average current $I_{Qx\_avg}$ and $I_{Qy\_avg}$ flowing in the main switch Qx and the second switch Qy may be respectively calculated as $$\frac{I_o V_2}{V_{in}}$$

and $I_o$, and thus, conduction power losses $P_{Qx\_pass}$, and $P_{Qy\_pass}$ by the main switch Qx and the second switch Qy may be respectively calculated as $$\left(\frac{I_o^2 V_2}{V_{in}}\right)^2 R_{sw}$$

and $I_o^2 R_{sw}$. Further, in this case, the switching power losses $P_{Qx\_sw}$ and $P_{Qy\_sw}$ of the main switch Qx and the second switch Qy may be $$\frac{C_{sw}(V_{in} - V_2)^2}{T_{s1}} \text{ and } \frac{C_{sw}(V_{in} - I_o R_o)^2}{T_{s2}},$$

respectively. It is assumed that the main switch Qx and the second switch Qy may use a single switching device, and a resistance of a switch and a capacitance of both ends of a switch are $R_{sw}$ and $C_{sw}$, respectively, to be equal to each other.

The results described above may be referred to in Table 1 below. According to the present embodiment, it can be appreciated that a maximum voltage applied to both ends of the switch is reduced and a switching loss is improved.

TABLE 1

| | Light Source Apparatus of FIG. 14 (PRIOR ART) | Embodiment of FIG. 5 |
|---|---|---|
| Conduction Power Loss | $P_{Qpass} = \left(\frac{I_o^2 R_o}{V_{in}}\right)^2 R_{sw}$ | $P_{Qx\_pass} = \left(\frac{I_o^2 V_2}{V_{in}}\right)^2 R_{sw}$ |
| | $P_{FWpass} = \left(I_o - \frac{I_o^2 R_o}{V_{in}}\right)^2 R_{sw}$ | $P_{Qy\_pass} = I_o^2 R_{sw}$ |
| Switching Power Loss | $P_{Qsw} = P_{FWDsw} = \frac{C_{sw} V_{in}^2}{T_s}$ | $P_{Qx\_sw} = \frac{C_{sw}(V_{in} - V_2)^2}{T_{s1}}$ |
| | | $P_{Qy\_sw} = \frac{C_{sw}(V_{in} - I_o R_o)^2}{T_{s2}}$ |

In addition, the light source apparatus 200 according to the present embodiment may further include a voltage stabilizer C2 connected in parallel between an output terminal of the main switch Qx and an input terminal of the second switch Qy. The voltage stabilizer C2 may be implemented by a capacitor and may effectively remove noise of power applied to the LED string 240.

Figure 6:
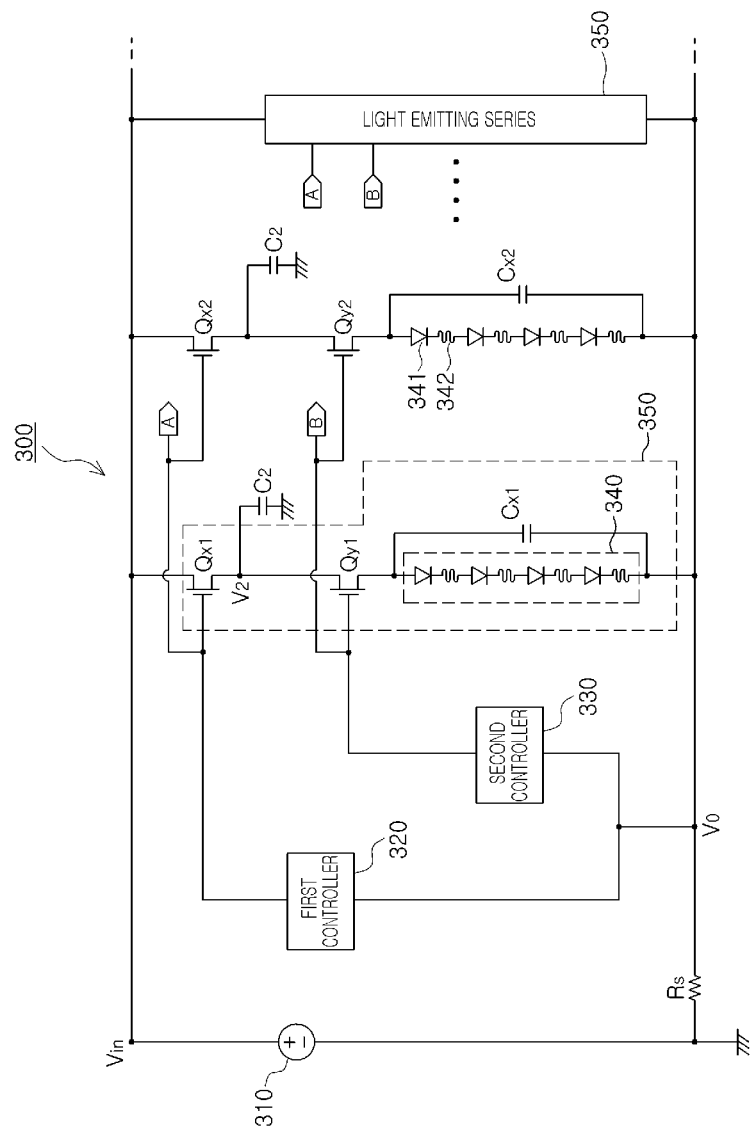
FIGS. 6 to 9 are circuit diagrams of a light source apparatus according to another embodiment of the present disclosure.

FIG. 6 illustrates a light source apparatus 300 according to another embodiment.

With reference to FIG. 6, the light source apparatus 300 may include at least two light emitting series 350 connected in parallel with each other with respect to power applied thereto. The light emitting series 350 may be defined as a set including an LED string 340, a main switch Qx, a capacitor Cx and a second switch Qy, and the LED string 340 may include at least one light emitting diode 341 and at least one inductance unit 342 generating an induced current according to a change in a current applied to the light emitting diode 341. In the present embodiment, it may be understood that the main switch Qx and the second switch Qy described in the foregoing embodiment are distributed in each LED string 340.

In the present embodiment, the light source apparatus 300 may further include first and second controller 320 and 330 respectively providing first and second switching control signals to the main switch Qx and the second switch Qy. Although the light source apparatus 300 may also include the first and second controller 320 and 330 for each light emitting series 350, the light source apparatus 300 may have a structure in which the control signal is transmitted to the main switches Qx and the second switches Qy of the plurality of light emitting series 350 from a single first controller 320 and a single second control unit 330, as shown in FIG. 6. Further, the first controller 320 and the second control unit 330 may be implemented as a single controller.

With reference to the embodiment of FIG. 6, maximum potential differences $V_{Qx\_max}$ and $V_{Qy\_max}$ respectively applied to input and output terminals of the main switch Qx and the second switch Qy may be $V_{in} - V_2$ and $V_2 - I_o R_o$ respectively. In addition, average current $I_{Qx\_avg}$, and $I_{Qy\_avg}$ flowing in the main switch Qx and the second switch Qy may be respectively calculated as $$\frac{I_o V_2}{V_{in} N} \text{ and } \frac{I_o}{N}.$$

Thus, the conduction power losses $P_{Qx\_pass}$ and $P_{Qy\_pass}$ by the main switch Qx and the second switch Qy may be respectively calculated as $$\left(\frac{I_o^2 V_2}{V_{in} N}\right)^2 R_{sw} \text{ and } \left(\frac{I_o}{N}\right)^2 R_{sw},$$

and the total conduction power losses of the main switch Qx and the second switch Qy may be respectively calculated as $$N\left(\frac{I_o^2 V_2}{V_{in} N}\right)^2 R_{sw} \text{ and } N\left(\frac{I_o}{N}\right)^2 R_{sw}.$$

In this case, the switching power losses $P_{Qx\_sw}$ and $P_{Qy\_sw}$ of the main switch Qx and the second switch Qy may be calculated as $$\frac{C_{sw}(V_{in} - V_2)^2}{T_{s1}} \text{ and } \frac{C_{sw}(V_{in} - I_o R_o)^2}{T_{s2}},$$

respectively. Here, it is assumed that the main switch Qx and the second switch Qy may use a single switching device, and a resistance of a switch and a capacitance of both ends of a switch are $R_{sw}$ and $C_{sw}$, respectively, to be equal to each other. $R_o$ refers to one equivalent resistor of the LED string 340.

TABLE 2

| | Light Source Apparatus of FIG. 14 (PRIOR ART) | Embodiment of FIG. 6 |
|---|---|---|
| Conduction Power Loss | $P_{Qpass} = \left(\frac{I_o^2 R_o}{V_{in}}\right)^2 R_{sw}$ | $P_{Qx\_pass} = \left(\frac{I_o^2 V_2}{V_{in} N}\right)^2 R_{sw}$ |
| | $P_{FWpass} = \left(I_o - \frac{I_o^2 R_o}{V_{in}}\right)^2 R_{sw}$ | $P_{Qy\_pass} = \left(\frac{I_o}{N}\right)^2 R_{sw}$ |
| Switching Power Loss | $P_{Qsw} = P_{FWsw} = \frac{C_{sw} V_{in}^2}{T_s}$ | $P_{Qx\_sw} = \frac{C_{sw}(V_{in} - V_2)^2}{T_{s1}}$ |
| | | $P_{Qy\_sw} = \frac{C_{sw}(V_{in} - I_o R_o)^2}{T_{s2}}$ |

Referring to Table 2 above, it can be appreciated that the conduction power loss is effectively reduced as compared to the light source apparatus described with reference to FIG. 14. In particular, in a case in which the input voltage is relatively low and the number of LED strings connected to one another in parallel are increased to thus require a relatively large Io value, the main switches and the second switches are distributed to be provided for each LED string, thereby reducing a conduction power loss of a device and improving power consumption efficiency. In addition, heat radiation of a driving circuit is reduced so as to reduce the size of a heat radiating plate, and since it is unnecessary to include a separate inductance device, miniaturization of the device may be implemented.

Figure 7:
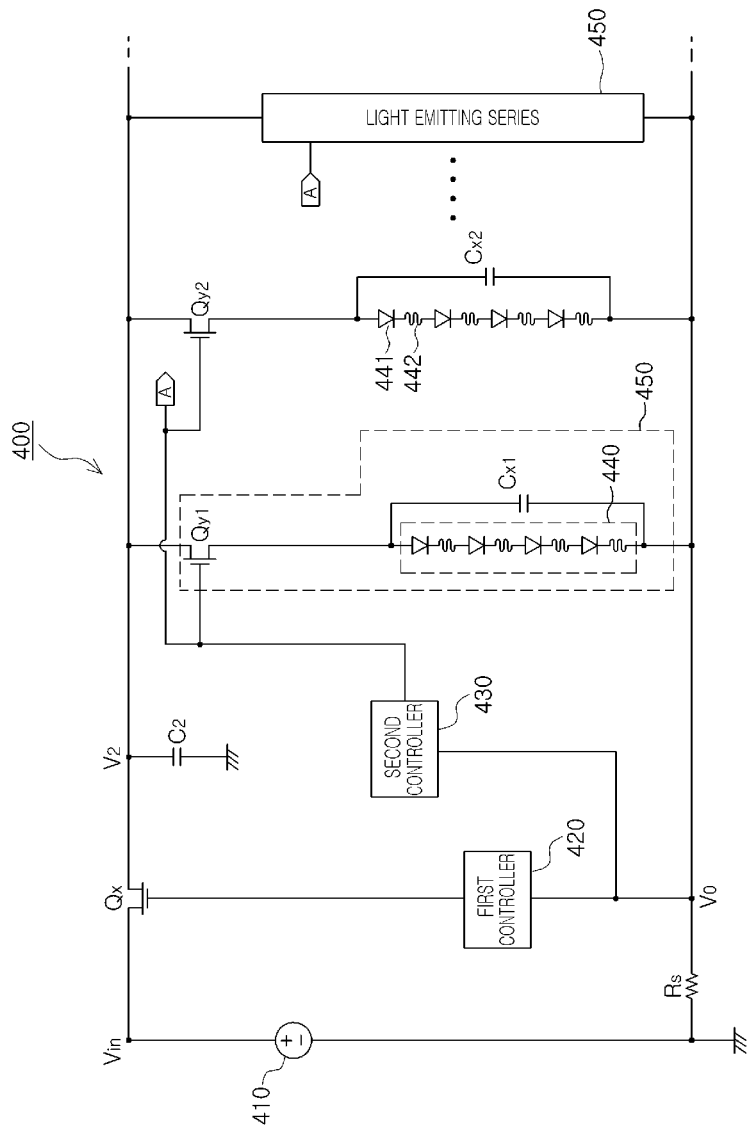

FIG. 7 is a circuit diagram illustrating another example of a light source apparatus 400, varied from the embodiment of FIG. 6.

With reference to FIG. 7, the light source apparatus 400 may include at least two light emitting series 450 connected in parallel with each other. In the present embodiment, the light emitting series 450 may be defined as a set including an LED string 440, a capacitor Cx and a second switch Qy, and this may be understood to have a type in which the main switch Qx is excluded from the light emitting series 340 defined in the embodiment of the FIG. 6. Here, since the main switch Qx does not need to be provided for each light emitting series, the number of devices may be reduced. The light source apparatus 400 may further include power source 410 and first and second controller 420 and 430 respectively providing first and second switching control signals to the main switch Qx and the second switch Qy.

Figure 8:
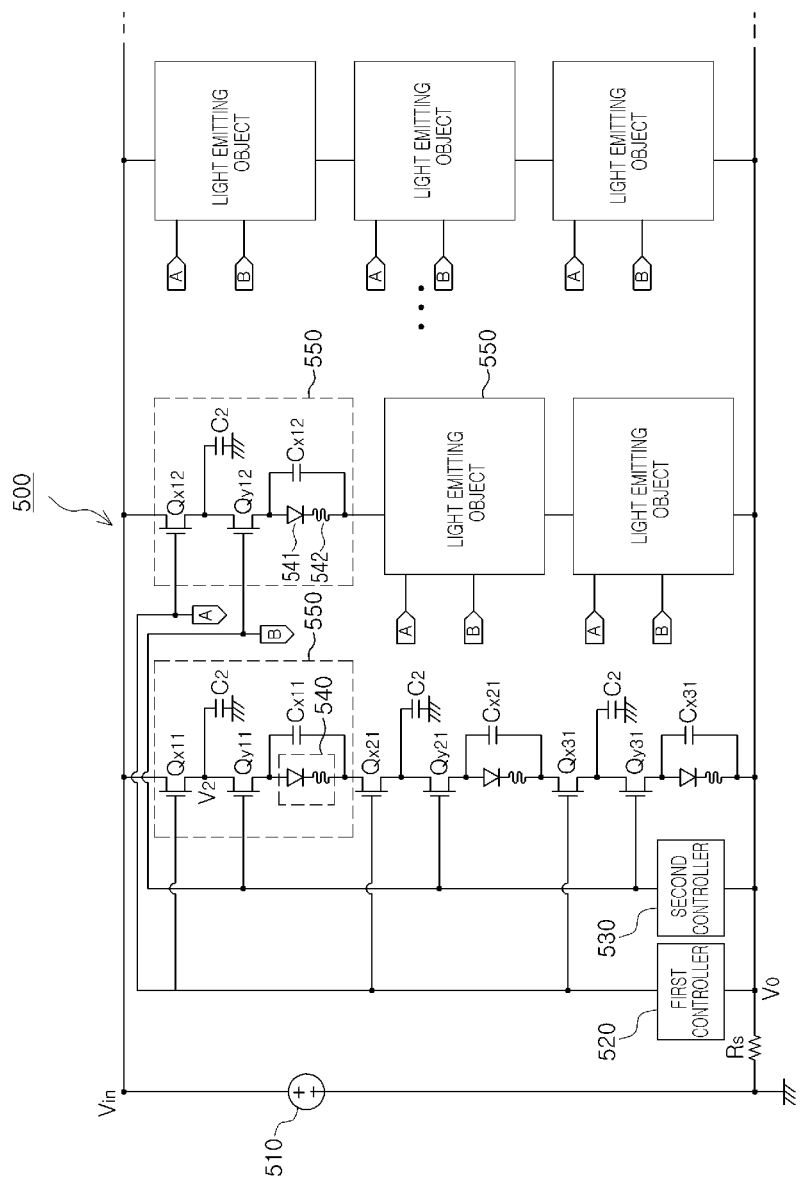

FIG. 8 is a circuit diagram of a light source apparatus 500 according to another embodiment.

With reference to FIG. 8, the light source apparatus 500 may include a plurality of light emitting objects 550 connected to one another in series and in parallel. The light source apparatus 500 may further include power source 510. The light emitting object 550 may be defined as a set including an LED string 540, a main switch Qx, a capacitor Cx, and a second switch Qy, and here, the LED string 540 may include at least one light emitting diode 541 and at least one inductance unit 542 generating an induced current according to a change in a current applied to the light emitting diode 541.

Here, it may be understood that the main switch Qx and the second switch Qy described in the embodiment of FIG. 4 are distributed as a single light emitting diode (541) unit.

In the present embodiment, the light source apparatus 500 may further first and second controller 520 and 530 respectively providing first and second switching control signals to the main switch Qx and the second switch Qy. Although the light source apparatus 500 may also include the first and second controller 520 and 530 for each light emitting object 550, the light source apparatus 500 may have a structure in which the control signal is transmitted to the main switches Qx and the second switches Qy of the plurality of light emitting objects 550 from a single first controller 520 and a single second control unit 530, as shown in FIG. 8.

Referring to the present embodiment, $I_o$ may be divided into $I_o/N$, and $V_{in}$ and $V_2$ are respectively divided into $V_{in}/M$ and $V_2/M$, such that power consumption efficiency may be effectively improved. (N indicates a parallel number of the light emitting object 550, and M indicates a serial number of the light emitting object 550).

With reference to the embodiment of FIG. 8, maximum potential differences $V_{Qx\_max}$ and $V_{Qy\_max}$ respectively applied to input and output terminals of the main switch Qx and the second switch Qy may be $$\frac{V_{in} - V_2}{M} \text{ and } \frac{V_2}{M} - I_o R_o,$$

respectively, and average current $I_{Qx\_avg}$ and $I_{Qy\_avg}$ flowing in the main switch Qx and the second switch Qy may be respectively calculated as $$\frac{I_o V_2}{V_{in} N} \text{ and } \frac{I_o}{N}.$$

Thus, the conduction power losses $P_{Qx\_pass}$ and $P_{Qy\_pass}$ by the main switch Qx and the second switch Qy may be respectively calculated as $$\left(\frac{I_o^2 V_2}{V_{in} N}\right)^2 R_{sw} \text{ and } \left(\frac{I_o}{N}\right)^2 R_{sw},$$

and the total conduction power losses of the main switch Qx and the second switch Qy may be $$N\left(\frac{I_o^2 V_2}{V_{in} N}\right)^2 R_{sw} \text{ and } N\left(\frac{I_o}{N}\right)^2 R_{sw}.$$

In this case, the switching power losses $P_{Qx\_sw}$ and $P_{Qy\_sw}$ of the main switch Qx and the second switch Qy may be calculated as $$\frac{C_{sw}(V_{in} - V_2)^2}{T_{s1} M^2} \text{ and } \frac{C_{sw}}{T_{s2}}\left(\frac{V_2}{M} - I_o R_o\right)^2,$$

respectively. Here, it is assumed that the main switch Qx and the second switch Qy may use a single switching device, and a resistance of a switch and a capacitance of both ends of a switch are $R_{sw}$ and $C_{sw}$, respectively, to be equal to each other. The results described above are compared to those of the light source apparatus of FIG. 14 and the comparison results therefrom are shown in Table 3 below.

TABLE 3

| | General DC/DC Converter | Embodiment |
|---|---|---|
| Conduction Power Loss | $P_{Qpass} = \left(\frac{I_o^2 R_o}{V_{in}}\right)^2 R_{sw}$ | $P_{Qx\_pass} = \left(\frac{I_o^2 V_2}{V_{in} N}\right)^2 R_{sw}$ |
| | $P_{FWpass} = \left(I_o - \frac{I_o^2 R_o}{V_{in}}\right)^2 R_{sw}$ | $P_{Qy\_pass} = \left(\frac{I_o}{N}\right)^2 R_{sw}$ |
| Switching Power Loss | $P_{Qsw} = P_{FWsw} = \frac{C_{sw} V_{in}^2}{T_s}$ | $P_{Qx\_sw} = \frac{C_{sw}(V_{in} - V_2)^2}{T_{s1} M^2}$ |
| | | $P_{Qy\_sw} = \frac{C_{sw}}{T_{s2}}\left(\frac{V_2}{M} - I_o R_o\right)^2$ |

With reference to Table 3 above, it can be appreciated that the switching power loss is further reduced. In addition, driving circuits of the light source apparatus 500 may be distributed in each light emitting diode (541) unit, and the light diode 541 and the heat radiating plate may be shared, such that miniaturization and lightness of the light source apparatus 500 may be further enhanced.

Figure 9:
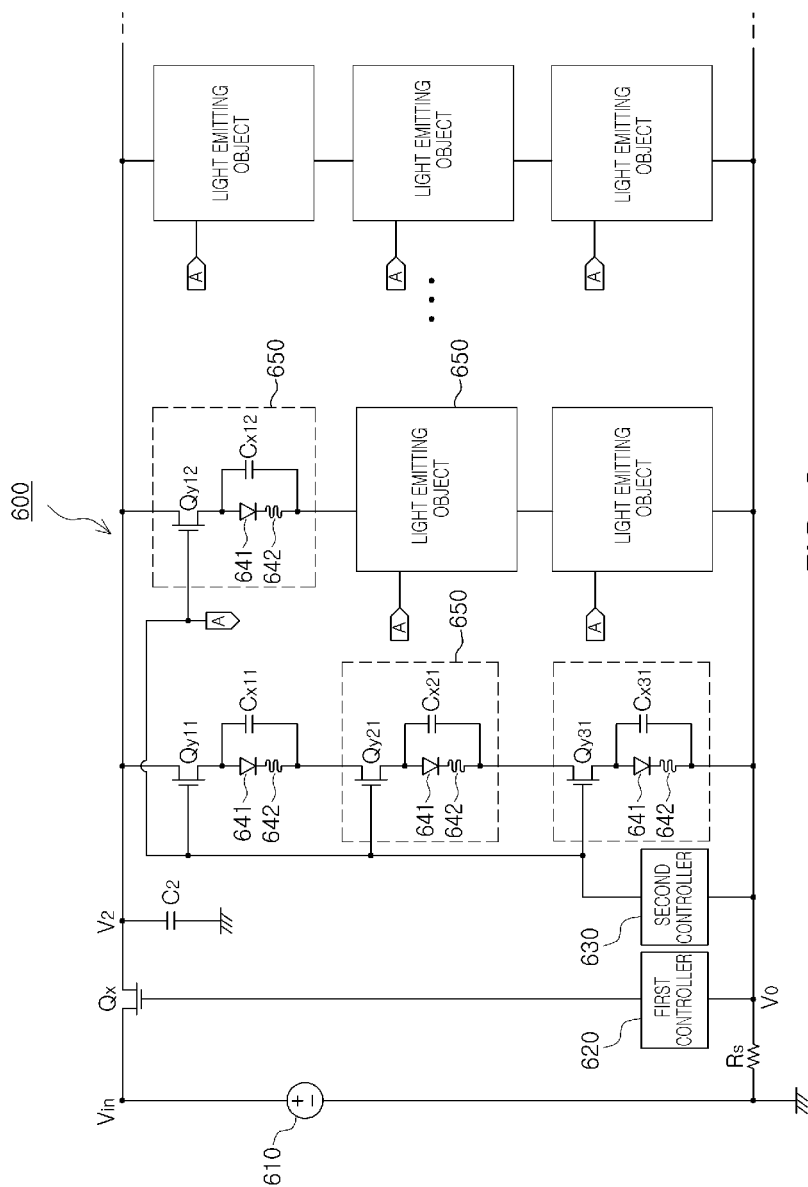

FIG. 9 is a circuit diagram of a light source apparatus 600 illustrating another example of the embodiment of FIG. 8.

With reference to FIG. 9, the light source apparatus 600 may include a main switch Qx and a plurality of light emitting objects 650 connected to one another in series and in parallel. The light source apparatus 600 may further include a power source 610. Here, the light emitting object 650 may be defined as a set including an LED string 640, a capacitor Cx, and a second switch Qy, and here, this may be understood to have a type in which the main switch Qx is excluded from the light emitting series 550 defined in the embodiment of FIG. 8. That is, since the main switch Qx may not be provided for each light emitting object 650, the number of devices may be reduced. The light source apparatus 600 may further include first and second control units 620 and 630 respectively providing first and second switching control signals to the main switch Qx and the second Qy.

Figure 10:
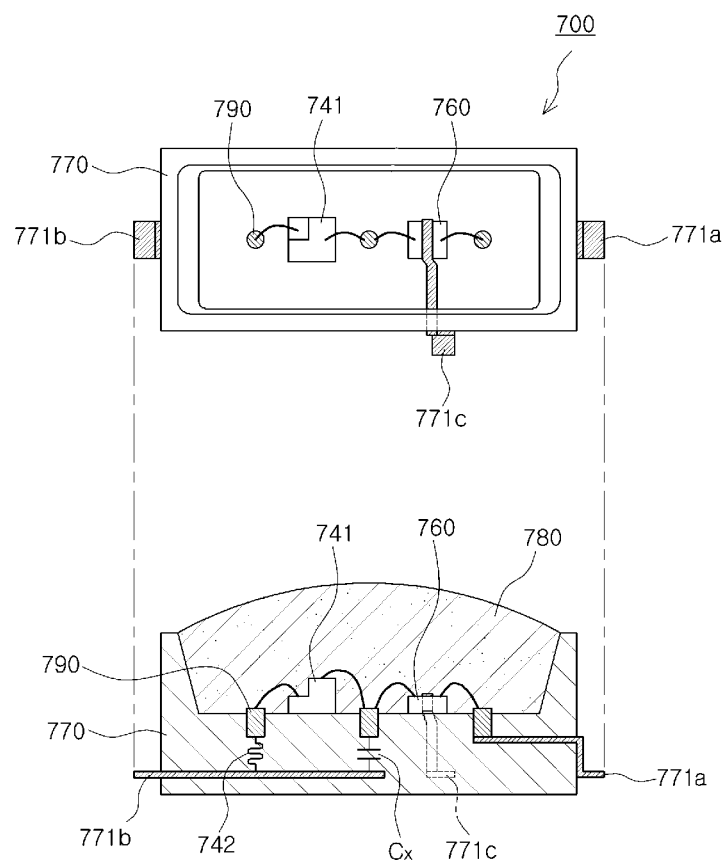
FIG. 10 provides a cross-sectional view and a plan view of a light emitting diode package according to an embodiment of the present disclosure.

FIG. 10 illustrates a light emitting diode package 700 implemented by distributing driving circuits of a light source apparatus according to an embodiment in a package unit.

With reference to FIG. 10, the light emitting diode package 700 according to an embodiment may include a light emitting diode 741, a package substrate 770 and input and output terminals, and the input and output terminal may include three terminals, that is, an input terminal 771a, an output terminal 771b, and a control terminal 771c.

The light emitting diode 741, a semiconductor device emitting light having a predetermined wavelength by external power applied thereto, may have an anode terminal and a cathode terminal.

The package substrate 770 may include a capacitor Cx, an inductance unit 742, and a switching device 760. Although the capacitor Cx may be provided as an individual element on the package substrate 770, the capacitor Cx may be implemented as an embedded capacitor as described in the foregoing embodiment.

The inductance unit 742 may be equal to that described in the foregoing embodiment, and may be connected in series to any one of the anode terminal and the cathode terminal of the light emitting diode 741 such that an induced current can be generated according to a change in a current applied to the light emitting diode 741.

The switching device 760 may include one end, the other end, and a control signal input terminal, and may perform an on/off switching operation according to an electrical signal applied to the control signal input terminal so as to switching control the electrical signal applied to the light emitting diode 741, but is not limited thereto. A transistor may be used in a similar manner to the switch described in the foregoing embodiment, that is, the main switch Qx or the second switch Qy.

The input terminal 771a provided with the light emitting diode package 700 may be electrically connected to the anode terminal of the light emitting diode 741 so as to provide the electrical signal to the light emitting diode 741. The output terminal 771b provided with the light emitting diode package 700 may receive the electrical signal output from the cathode terminal of the light emitting diode 741. The input terminal 771a and the output terminal 771b may have a structure in which they are exposed to the outside from the package substrate 770 as shown in FIG. 10, and may have a structure in which they are respectively electrically connected to the anode terminal and the cathode terminal of the light emitting diode 741 through a lead-out conductor 790 of which at least a portion is embedded in the package substrate 770.

In addition, the light emitting diode package 700 may include the control terminal 771c, and the switching device 760 may receive a switching control signal applied externally through the control terminal 771c. Here, the input terminal 771a, the output terminal 771b and the control terminal 771c may be spaced apart from one another to be electrically isolated.

The light diode package 700 may contain a molding part 780 allowing the light emitting diode 741 to be embedded therein. The molding part 780 may be coated on an upper surface of the package substrate 770 to cover an upper surface and lateral surfaces of side portions of the light emitting diode 741, and may be formed of a resin obtained by mixing phosphors and silicon with each other at a predetermined ratio. The molding part may be formed to have a predetermined thickness by using one coating method of a squeegee, a screen printing method, a silk screen printing method, a stencil printing method, a dispensing method, and the like.

Figure 11:
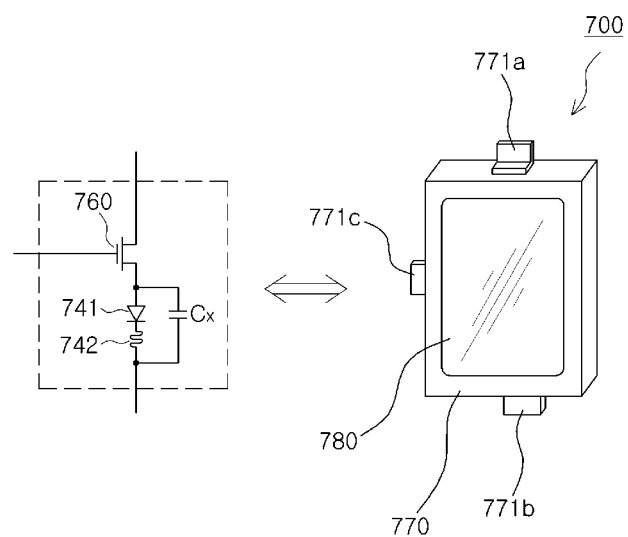
FIG. 11 illustrates a circuit included in the light emitting diode package of FIG. 10 according to the embodiment of the present disclosure.

The circuit configuration of the light emitting diode package 600 according to the present embodiment will be described in more detail with reference to FIG. 11. Referring to FIG. 11, the light emitting diode 741 may be connected in parallel to the capacitor Cx with respect to the switching device 760, and at least one of the anode terminal and the cathode terminal of the light emitting diode 741 may be connected in series to the inductance unit. The switching device 760 may be connected to control the electrical signal that is transmitted through the input terminal 771a, the light emitting diode 741 and then the output terminal 771b. Meanwhile, the on/off switching operation of the switching device 760 may be performed by a switching control signal input from the outside to the switching device 760 through the control terminal 771c.

That is, the light emitting diode package 700 according to the present embodiment may be understood as the light emitting series 450 described with reference to FIG. 7 or the light emitting object 650 described with reference to FIG. 9 implemented in a light emitting diode package unit.

Figure 12:
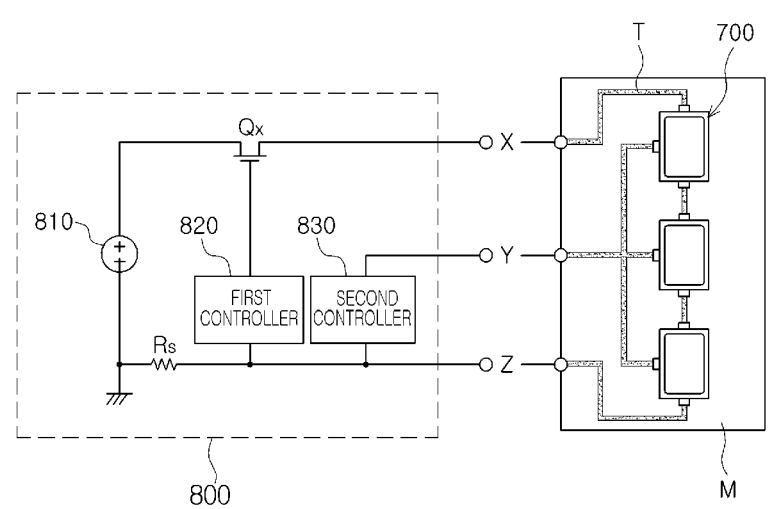
FIG. 12 illustrates an example of the light emitting diode package used according to the embodiment of the present disclosure of FIG. 11.
Figure 13:
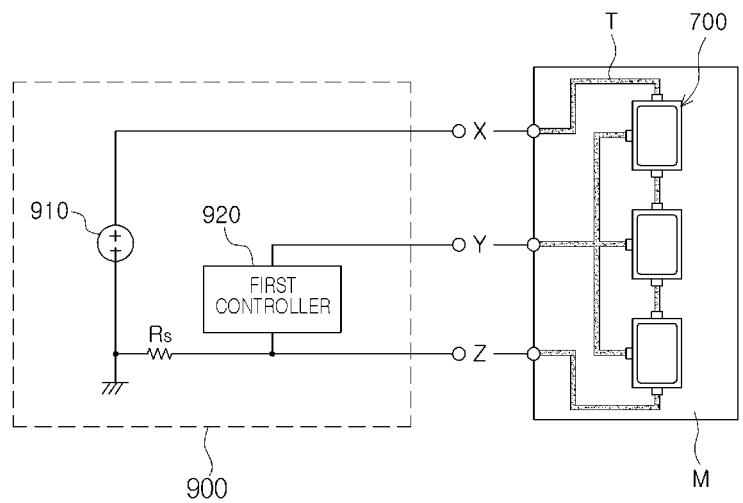
FIG. 13 illustrates another example of the light emitting diode package according to the embodiment of the present disclosure of FIG. 11.

FIGS. 12 and 13 illustrate examples of the light emitting diode package 700 used according to the present embodiment. With reference to FIG. 12, a power circuit 800 may include a power source unit 810, a main switch Qx, and a first control unit 820 applying the first switching control signal to the main switch Qx so as to control a switching operation of the main switch Qx. In addition, the power circuit 800 may include a second control unit 830 outputting a second switching control signal, and three input/output terminals, X, Y and Z terminals. Here, the Y terminal is allocated to apply the second switching control signal to the switching device 760 included in the respective light emitting diode packages 700. The respective light emitting diode packages 700 may be mounted on the printed circuit board M having a conductive wire pattern T formed thereon, and may be connected to the input/output terminals X, Y and Z, respectively, through the conductive wire pattern T. According to the present embodiment, the driving circuits of the light source apparatus may be distributed in a package unit and thus, the light emitting diode package 700 only driven by a simple power circuit 800 may be obtained. In addition, the power circuit 800 does not include a separate inductor such that the dimension thereof can be reduced, and accordingly, a light source apparatus miniaturized by employing the light emitting diode package 700 may be obtained.

FIG. 13 illustrates an example of a variation of the light emitting diode package 700 of FIG. 12. With reference to FIG. 13, a power circuit 900 may include a power source unit 910 and a controller 920 outputting a first switching control signal for controlling a switching operation of the switching device 760 included in the respective light emitting diode packages 700. According to the present embodiment, the driving circuits may be distributed in a package unit and thus the light emitting diode package 700 only driven by a simple power circuit 900 may be obtained.

As set forth above, according to an embodiment, a miniaturized light source apparatus having power consumption efficiency may be provided.

According to another embodiment of the present inventive concept, a light emitting diode package in which the light source apparatuses are distributed and embedded for respective packages may be provided.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A light source apparatus comprising:
at least one LED string including at least one LED and at least one inductance unit disposed in the LED string and configured for generating an induced current according to a change in a current applied to the LED;
a main switch configured for controlling power applied to the LED string according to an on/off switching operation;
a capacitor charged with a voltage of the power applied to the LED string when the main switch is switched on and configured for applying the charged voltage to the LED string when the main switch is switched off; and
a second switch configured for controlling the power applied to the LED string from the main switch according to an on/off switching operation,
wherein the capacitor is charged with the voltage of the power applied to the LED string when the main switch and the second switch are switched on, and applies the charged voltage to the LED string when the main switch or the second switch is switched off.

2. The light source apparatus of claim 1, wherein the inductance unit is disposed inside a circuit substrate and includes a single-layer single conductive wire or a multilayer conductive layer of a helical structure, containing an inductance component.

3. The light source apparatus of claim 1, further comprising:
a controller configured for receiving an electrical signal output from the LED string to output a switching control signal,
the main switch performing an on/off switching operation in response to the switching control signal of the controller.

4. The light source apparatus of claim 3, wherein:
the controller outputs a pulse width modulation (PWM) control signal as the switching control signal, and
a PWM signal period of the switching control signal is set to be smaller as an inductance value of the inductance unit is decreased.

5. The light source apparatus of claim 1, further comprising:
a voltage stabilizer connected in parallel between an output terminal of the main switch and an input terminal of the second switch.

6. The light source apparatus of claim 1, further comprising:
a first controller configured for receiving the electrical signal output from the LED string and outputting a first switching control signal, and
a second controller configured for outputting a second switching control signal,
wherein the main switch and the second switch respectively perform an on/off switching operation in response to the first switching control signal and the second switching control signal.

7. The light source apparatus of claim 6, wherein:
the first controller and the second controller output a first PWM control signal and a second PWM control signal as the first switching control signal and the second switching control signal, respectively,
a signal period of the second PWM control signal is longer than that of the first PWM control signal, and
an on time of the second PWM control signal is longer than an on time of the first PWM control signal.

8. The light source apparatus of claim 1, wherein when a set of the LED string, the main switch, the capacitor and the second switch is defined as a single light emitting series, the light emitting series is at least two connected in parallel with each other.

9. The light source apparatus of claim 1, wherein when a set of the LED string, the capacitor and the second switch is defined as a single light emitting series, the light emitting series is at least two connected in parallel with each other.

10. The light source apparatus of claim 1, wherein the light emitting diode included in the LED string is one, and when a set of the LED string, the main switch, the capacitor and the second switch is defined as a single light emitting object, the light emitting object is provided in a plurality, connected to one another in series and in parallel.

11. The light source apparatus of claim 1, wherein the light emitting diode included in the LED string is one, and when a set of the LED string, the capacitor and the second switch is defined as a single light emitting object, the light emitting object is provided in a plurality, connected to one another in series and in parallel.

12. A light emitting diode package comprising:
a light emitting diode (LED) having an anode terminal and a cathode terminal;

a package substrate including a capacitor, an inductance unit, and a switching device having a control signal input terminal, and including the LED mounted thereon;

an input terminal configured for applying an electrical signal to the anode terminal of the LED;

an output terminal configured for receiving the electrical signal output from the cathode terminal of the LED; and a control terminal configured for applying a control signal to the control signal input terminal of the switching device, at least one of the inductance units being connected between the anode terminal of the LED and the input terminal or between the cathode terminal of the LED and the output terminal, and generating an inducted current according to a change in a current applied to the LED, the capacitor being connected in parallel with the LED, and the switching device configured for performing an on/off switching operation in response to a control signal applied to the control signal input terminal from the control terminal so as to control the electrical signal applied to the LED.

13. The light emitting diode package of claim 12, further comprising:

a lead out conductor embedded in the package substrate, wherein the anode terminal of the LED and the input terminal and the cathode terminal of the LED and the output terminal are electrically connected to each other through the lead out conductor, respectively.

14. The light emitting diode package of claim 12, wherein the input terminal, the output terminal, and the control terminal are spaced apart from one another so as to be electrically isolated.

15. A light source apparatus comprising:

a plurality of LED strings each including a plurality of LEDS;

a power source for supplying a current to the plurality of LED strings;

a conductive wire or multilayer conductive layer comprising an inductance component for generating an induced current according to a change in the current applied to the LEDS;

a first controller configured for receiving an electrical signal output from the LED strings and outputting a first switching control signal;

a second controller configured for outputting a second switching control signal, a main switch configured for controlling the current applied to the LED strings according to an on/off switching operation;

a second switch configured for controlling the current applied to the LED strings from the main switch according the on/off switching operation; and a capacitor charged with a voltage of the current applied to the LED strings when the main switch is switched on and configured for applying the charged voltage to the LED strings when the main switch is switched off, wherein the main switch and the second switch respectively perform the on/off switching operation in response to the first switching control signal and the second switching control signal.

16. The light source apparatus of claim 15, wherein the conductive wire or multilayer conductive layer is disposed inside a circuit substrate, and the conductive wire includes a single-layer single conductive wire and the multilayer conductive layer includes a helical structure.

17. The light source apparatus of claim 15, wherein:

the first controller outputs a pulse width modulation (PWM) control signal as the first switching control signal, and a PWM signal period of the first switching control signal is set to be smaller as an inductance value of the inductance component is decreased.

18. The light source apparatus of claim 15, wherein:

the capacitor is charged with the voltage of the current applied to the LED strings when the main switch and the second switch are switched on, and applies the charged voltage to the LED strings when the main switch or the second switch is switched off.

19. The light source apparatus of claim 18, further comprising:

a voltage stabilizer connected in parallel between an output terminal of the main switch and an input terminal of the second switch.

* * * * *